United States Patent
Che et al.

(10) Patent No.: US 12,368,113 B2
(45) Date of Patent: Jul. 22, 2025

(54) METHODS AND APPARATUS FOR USING SPACER-ON-SPACER DESIGN FOR SOLDER JOINT RELIABILITY IMPROVEMENT IN SEMICONDUCTOR DEVICES

(71) Applicant: Micron Technology, Inc., Boise, ID (US)

(72) Inventors: Faxing Che, Singapore (SG); Hong Wan Ng, Singapore (SG); Yeow Chon Ong, Singapore (SG); Wei Yu, Singapore (SG); Ling Pan, Singapore (SG); Lin Bu, Singapore (SG)

(73) Assignee: Micron Technology, Inc., Boise, ID (US)

( * ) Notice: Subject to any disclaimer, the term of this patent is extended or adjusted under 35 U.S.C. 154(b) by 455 days.

(21) Appl. No.: 17/976,409

(22) Filed: Oct. 28, 2022

(65) Prior Publication Data
US 2023/0207488 A1    Jun. 29, 2023

Related U.S. Application Data

(60) Provisional application No. 63/293,374, filed on Dec. 23, 2021.

(51) Int. Cl.
| | |
|---|---|
| *H01L 23/00* | (2006.01) |
| *H01L 23/498* | (2006.01) |
| *H01L 25/00* | (2006.01) |
| *H01L 25/065* | (2023.01) |

(52) U.S. Cl.
CPC ...... *H01L 23/562* (2013.01); *H01L 23/49816* (2013.01); *H01L 23/49838* (2013.01); *H01L 25/0652* (2013.01); *H01L 25/50* (2013.01); *H01L 24/32* (2013.01); *H01L 24/48* (2013.01); *H01L 24/73* (2013.01); *H01L 2224/32145* (2013.01); *H01L 2224/32245* (2013.01); *H01L 2224/48011* (2013.01); *H01L 2224/48091* (2013.01); *H01L 2224/48145* (2013.01); *H01L 2224/48221* (2013.01);

(Continued)

(58) Field of Classification Search
CPC ............ H01L 23/562; H01L 23/49816; H01L 23/49838
See application file for complete search history.

(56) References Cited

U.S. PATENT DOCUMENTS

| | | | |
|---|---|---|---|
| 10,971,473 B2 * | 4/2021 | Kosaka | ............... H01L 23/3128 |
| 2005/0184378 A1 * | 8/2005 | Sasaki | ..................... H01L 23/16 |
| | | | 257/E23.125 |

(Continued)

*Primary Examiner* — Errol V Fernandes
(74) *Attorney, Agent, or Firm* — Dorsey & Whitney LLP (57) ABSTRACT

A semiconductor package assembly includes a substrate, a die stack including at least a bottom die, an inert top spacer, and at least a first inert base spacer. The inert top and base spacers are exclusive of any circuits. A top surface of the inert top spacer is directly attached to a bottom surface of the bottom die in the die stack. A top surface of the first inert base spacer is directly attached to a bottom surface of the inert top spacer and a bottom surface of the first inert base spacer is directly attached to the substrate. The footprint of the inert base spacer is smaller than the footprint of the inert top spacer. In some embodiments, the footprint of the inert base spacer is positioned entirely within the footprint of the inert top spacer.

20 Claims, 9 Drawing Sheets

(52) U.S. Cl.
CPC ............... *H01L 2224/73215* (2013.01); *H01L 2224/73265* (2013.01); *H01L 2924/1438* (2013.01); *H01L 2924/182* (2013.01)

(56) References Cited

U.S. PATENT DOCUMENTS

| | | | |
|---|---|---|---|
| 2006/0012018 A1* | 1/2006 | Karnezos | H01L 25/0652 |
| | | | 257/E25.011 |
| 2018/0122771 A1* | 5/2018 | Park | H01L 23/49 |
| 2019/0237432 A1* | 8/2019 | Park | H01L 25/043 |
| 2022/0059473 A1* | 2/2022 | Park | H01L 25/0652 |
| 2022/0130793 A1* | 4/2022 | Kang | H01L 24/73 |
| 2022/0165678 A1* | 5/2022 | Kim | H01L 23/295 |

* cited by examiner

METHODS AND APPARATUS FOR USING SPACER-ON-SPACER DESIGN FOR SOLDER JOINT RELIABILITY IMPROVEMENT IN SEMICONDUCTOR DEVICES

CROSS-REFERENCE TO RELATED APPLICATION(S)

The present application claims priority to U.S. Provisional Patent Application No. 63/293,374, filed Dec. 23, 2021, the disclosure of which is incorporated herein by reference in its entirety.

TECHNICAL FIELD

The present technology is directed to semiconductor device packaging. More particularly, some embodiments of the present technology relate to techniques for improving the reliability of solder joints of semiconductor devices, including high-density packages.

BACKGROUND

Semiconductor dies, including memory chips, microprocessor chips, logic chips and imager chips, are typically assembled by mounting a plurality of semiconductor dies, individually or in die stacks, on a substrate in a grid pattern. The assemblies can be used in mobile devices, computing, and/or automotive products. During manufacturing or field applications, solder joint interfaces can experience thermo-mechanical stress induced by different expansion and contraction rates of the semiconductor device and printed circuit board during cyclic temperature loading, that can result in reduced solder joint reliability. Also, during manufacturing processes such as chip mounting or attaching wire bonds, physical contact between an active die and the substrate may increase die corner stress and lead to cracking. If the crack length in a solder joint and/or die edge propagates to a critical value, an open circuit or electrical failure may occur, and the component can eventually fail to operate.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Specific details of several embodiments of semiconductor devices are described below, including method and apparatus for reducing coefficient of thermal expansion (CTE) mismatch between a semiconductor package and the printed circuit board (PCB) the package is attached to via solder balls. When a thick, large die (e.g., chip) or a die stack including multiple dies (e.g., that may include an active die such as a non-volatile storage technology such as a NAND, a dynamic random-access memory (DRAM), or other memory chips, microprocessor chips, logic chips, or imager chips as the bottom die in the die stack or within the die stack) is mounted directly onto a thin substrate, a large deformation can arise on solder joint interface(s) due to the CTE mismatch, and can lead to disconnection and/or weakening of solder bonds as well as delamination and/or cracking in the substrate. This can be a weak point of package reliability when the package is subjected to temperature cycling on board level (TCOB), as different materials expand different amounts. Embodiments described below include a method and apparatus for uplifting a large die or die stack by one or more relatively smaller base spacers that reduce the large chip/die stack interaction effect on solder joint reliability (SJR).

Relatively smaller-sized base spacer(s), sized and positioned for optimizing SJR, are used together with a relatively larger-sized top spacer that is positioned between the base spacer(s) and the bottom die of the die stack. This configuration can be referred to as "spacer-on-spacer" and can be accomplished using methods such as pick-and-place or other known assembly/manufacturing techniques. The base spacer(s) and top spacer can be formed of standard materials such as silicon, although other materials may be used. The top spacer and base spacer(s) are inert and exclusive of, or free from, any circuits. The inert top spacer supports the active die (e.g., NAND, etc.) during the assembly processes, such as during wire bonding. Further, the uplifting of the bottom die/die stack, advantageously reduces the die corner stress because the additional space between the bottom die and the substrate eliminates direct interaction between the bottom die and the substrate during the assembly and/or testing processes such as reflow, thus preventing the undesirable issue of die corner cracking.

An expected advantage and benefit are the ability to design the size (e.g., length, width), thickness, and location of the inert base spacer(s) to avoid positioning the inert base spacer(s) over critical solder joint locations on the substrate. This flexible sizing and location allow for different configurations to accommodate different solder ball layouts and requirements of different active dies/die stacks. Therefore, the inert base spacers eliminate direct CTE mismatch interaction between the bottom die and the substrate, while the inert top spacer provides structural support for the die/die stack during the assembly process (e.g., die attaching or wire bonding).

A further advantage of some embodiments is the reduction of stress on solder joint interface(s) that is induced by CTE mismatch between the silicon chip or die/die stack, solder joint interface(s), and the PCB during temperature cycling testing, which subsequently improves SJR significantly, such as by greater than 400%. The spacer-on-spacer configuration will thus improve the SJR for automotive and other applications that have stringent temperature cycling loading conditions and high SJR reliability requirements. The SJR is also enhanced due to the reduction of package warpage that is achieved through the flexible design of the inert base spacers in terms of the placement location and size. Accordingly, the SJR can be greatly enhanced without incurring high cost or changes in bill of materials and processes, resulting in a low-cost solution.

Further, molding compound, which fills at least a portion of the open spaces between the substrate and the exposed portions of the bottom surfaces of the larger-sized inert top spacer and the exposed portions of the bottom surfaces of the bottom die (if any) during the molding process, can function as a buffer layer to additionally isolate the CTE effects of the large active die on critical solder joints.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-8. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above" and "below", "top" and "bottom" can refer to relative directions or positions of features in the semiconductor devices in view of the orientation shown in the Figures. For example, "upper", "uppermost", or "top" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. Also, as used herein, features that are, can, or may be substantially equal are within 10% of each other, or within 5% of each other, or within 2% of each other, or within 1% of each other, or within 0.5% of each other, or within 0.1% of each other, according to various embodiments of the disclosure.

Figure 1A:
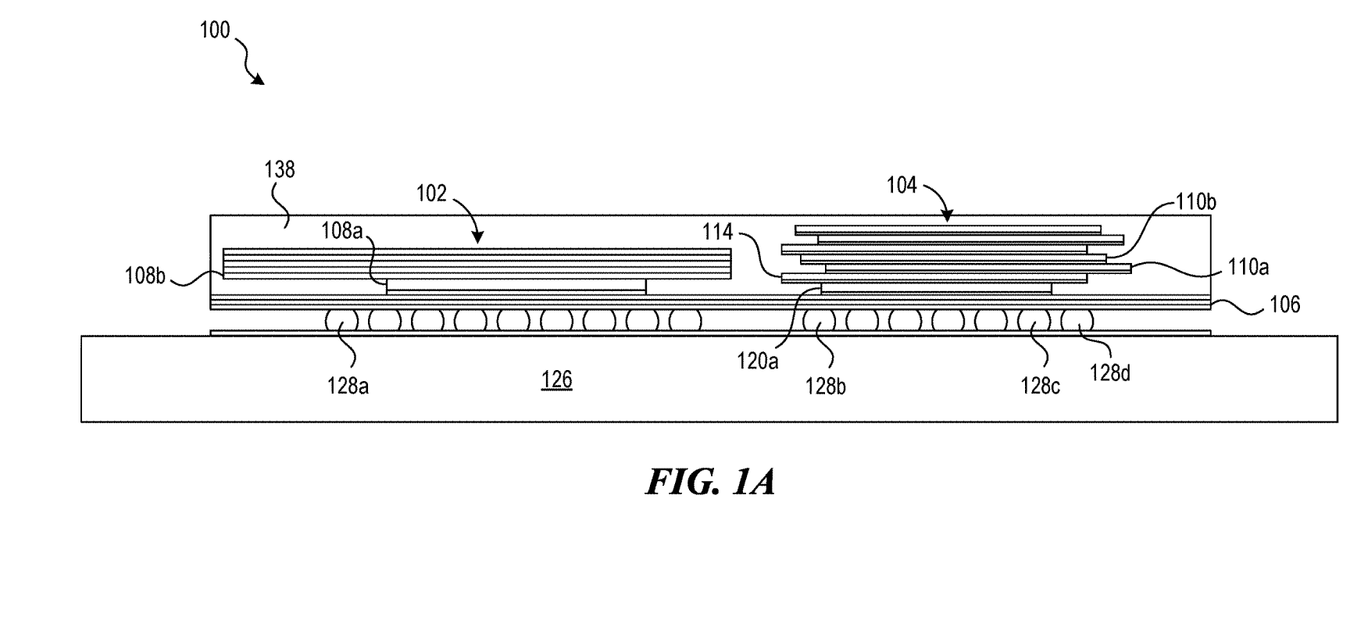
FIG. 1A is a cross-sectional view of a semiconductor device that includes a die stack that is uplifted with two layers of spacers and mounted on a substrate in a side-by-side configuration with another die stack in accordance with the present technology.
Figure 1B:
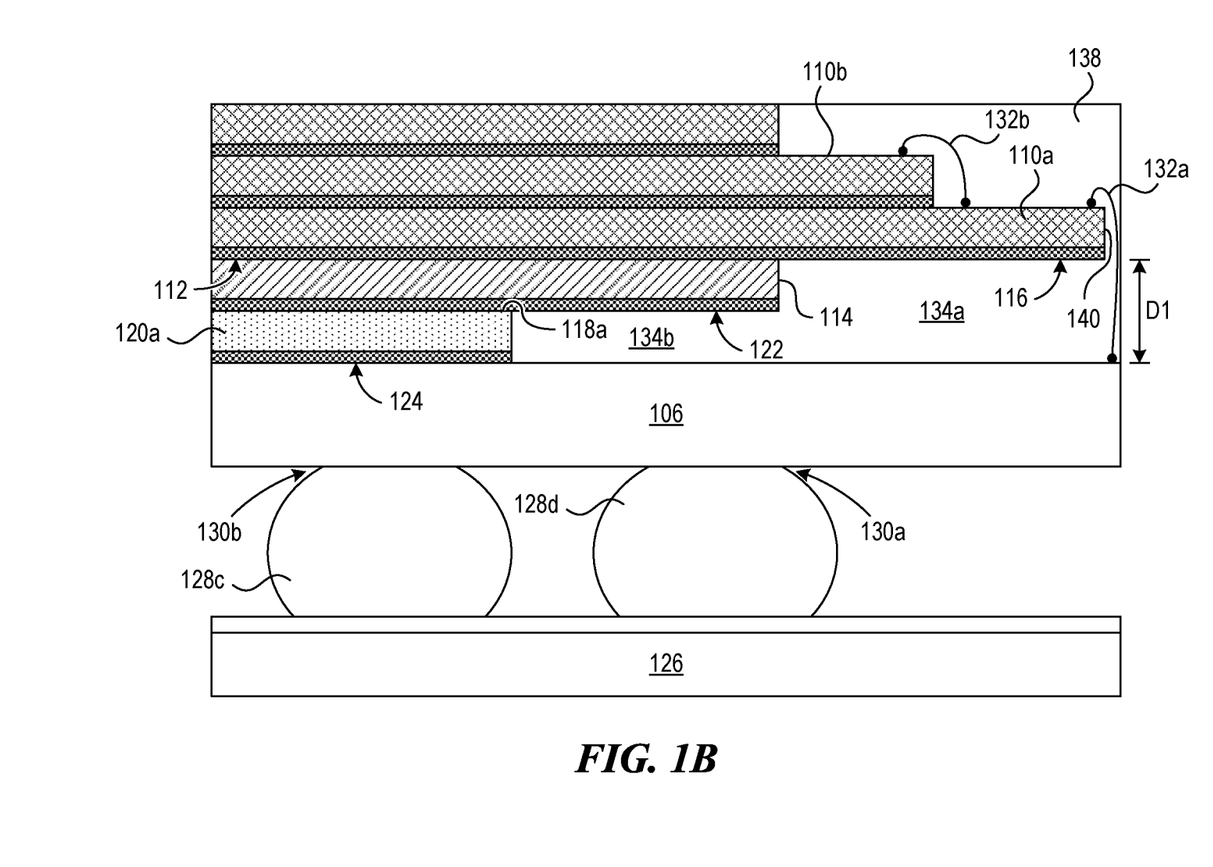
FIG. 1B is a cross-sectional view of a portion of the semiconductor device of FIG. 1A in accordance with the present technology.

FIGS. 1A and 1B illustrate an overview of the present technology, while FIGS. 2A-8 illustrate further details of the present technology. Like reference numbers relate to similar components and features in FIGS. 1A-8. The present technology addresses the technical problem of stress on solder joints due to temperature fluctuations, which can lead to crack initiation at corner and/or edge joints, as well as damage to dies that may contact the substrate during the assembly process. Two layers of inert spacers positioned between the die stack and the substrate can prevent the damage due to temperature fluctuations or physical contact.

FIG. 1A is a cross-sectional view of a semiconductor device 100 or semiconductor package assembly that has two die stacks 102, 104 mounted on a substrate 106 in a side-by-side configuration in accordance with the present technology. FIG. 1B is a sub-set of FIG. 1A, showing a portion of the bottom outside corner of the die stack 104, and will be discussed together with FIG. 1A. The die stacks 102, 104 can include vertically stacked semiconductor dies 108, 110 (not all dies are indicated) and/or other components and/or layers. As shown, the dies 108 in the die stack 102 are in alignment with each other, although the bottom die 108a (e.g., function die, microcontroller, etc.) as shown is relatively smaller in size. The dies 110 in the die stack 104 are shown as stepped or horizontally offset.

The bottom die 108a of the die stack 102 can be mounted directly to the substrate 106. In contrast, the bottom die 110a of die stack 104 is uplifted with respect to the substrate 106 by two layers of spacers. A top surface 112 of an inert top spacer 114 to directly attached or mounted to a bottom surface 116 of the bottom die 110a of the die stack 104. A top surface 118a of an inert base spacer 120a is directly attached or mounted to a bottom surface 122 of the inert top spacer 114 and a bottom surface 124 of the inert base spacer 120a is directly attached or mounted to the substrate 106. When the die stack 104 is uplifted with the inert top spacer 114 and the inert base spacer 120a, one or more open areas 134a are formed between exposed regions of the bottom surface 116 of the die stack 104 and the substrate 106. One or more open areas 134b are also formed between exposed regions of the bottom surface 122 of the inert top spacer 114 and the substrate 106.

As shown in FIG. 1B, the inert top spacer 114 has a shorter length than the bottom die 110a, and the inert base spacer 120a has a shorter length than the inert top spacer 114. A width of the inert top spacer 114 can be the same or smaller than the bottom die 110a, and a width of the inert base spacer 120a can be the same or smaller than the inert top spacer 114.

The inert top spacer 114 and the inert base spacer 120 are inert and exclusive of, or free from, any circuits, and thus do not provide electrical functionality or convey signals between the dies 110 and the substrate 106. The inert top spacer 114 and the inert base spacer 120 can be formed of silicon or other material, such as from a wafer, using a saw blade, etching, plasma, or other techniques. The dies 110, the inert top spacer 114, the inert base spacer 120, and the substrate 106 can be directly attached or mounted to each other using an adhesive such as die attach film or other known material.

After the die stacks 102, 104, the inert top spacer 114, the inert base spacer 120a, the wire bonds 132, etc. have been attached and/or mounted, molding material 138 is applied to encase the components mounted to the substrate 106. The molding material 138 can encase the top and side edges of the die stacks 102, 104, and extend into at least some of the open areas 134a between the exposed regions of the bottom surface 116 of the die stack 104 and the substrate 106, such as under the outer edge region of the NAND or bottom die 110a. The molding material 138 can also extend to fill at least some of the open areas 134b formed between the exposed regions of the bottom surface 122 of the inert top spacer 114 and the substrate 106.

The substrate 106 of the device 100 is attached to a printed circuit board (PCB) 126 with a plurality of solder balls 128 (e.g., solder balls 128a, 128b, 128c, 128d, although not all are individually indicated) that each comprise a solder joint 130 (e.g., solder joints 130a, 130b, although not all are individually indicated) between the solder ball 128 and the substrate 106. One or more solder joint 130 can be identified as a critical solder joint, such as solder joint 130a. Although indicated as the junction between the solder ball 128d and the substrate 106, the solder joint 130a can also encompass the junction between the solder ball 128d and the PCB 126. Critical solder joints 130 are often located near outer edges of a footprint of a solder ball grid pattern or layout, although are not so limited. For ease of description, not all of the solder balls 128 are shown in FIGS. 1A and 1B. Also, although not detailed in FIGS. 1A and 1B, the substrate 106 and the PCB 126 can each have a plurality of layers.

During the assembly process, prior to applying the molding material 138, downward pressure may be exerted upon the bottom die 110a, such as when attaching electrical connections such as the wire bond(s) 132a, 132b to stepped or offset dies 110, or while forming the die stack 104 in situ. The inert top spacer 114 and the inert base spacer 120a uplift the bottom die 110a to a distance D1 from the substrate 106 and thus prevent edges and/or corners of the bottom die 110a from contacting the substrate 106, which may result in damage such as cracking. This also increases the distance D1 between the bottom surface 116 of the die stack 104 and the critical solder joint 130a.

In some embodiments, the bottom die 110a in the die stack 104 can be a NAND die, which is a relatively large die. Without the inert top spacer 114 and the inert base spacer 120a, the NAND die may attach to area(s) of the substrate 106 that are located over the critical solder joints/balls. As shown in FIG. 1B, the inert top spacer 114 is smaller in size than the bottom die 110a, although the inert top spacer 114 and the bottom die 110a can have the same or generally the same length and/or width. The inert top spacer 114 can be sized to provide support to the bottom die 110a (e.g., NAND die) during the wire bonding process, die attaching process, and/or other assembly processes to prevent such issues as, but not limited to, cracking of the bottom die 110a. In some embodiments, if the bottom die 110a is relatively thicker and stronger, a relatively smaller inert top spacer 114 can be used. The inert base spacer 120a is smaller in size than the inert top spacer 114 and is attached to the substrate 106 at a location laterally interior of the one or more critical solder joint 130a, such that no structure associated with the die stack 104 is mounted to the substrate 106 over the identified critical solder joint(s) 130a.

More specifically, with respect to the example shown in FIG. 1B, an outer edge 140 of the bottom die 110a can extend to or beyond the location of the critical solder joint 130a. The inert top spacer 114 is smaller and does not extend to the outer edge 140 of the bottom die 110a, but can extend over and/or beyond the location of the critical solder joint 130a. The inert base spacer 120a is smaller than the inert top spacer 114 and is attached to the substrate 106 inboard of the critical solder joint 130a. Therefore, critical solder joint(s) 130a are located outside a footprint of the inert base spacer 120.

Although the two die stacks 102, 104 are shown in FIG. 1A, in other embodiments the device 100 can include more than one uplifted die stack 104 with one or more die stacks 102 and/or other components (not shown). Alternatively, the uplifted die stack 104 can be included in its own device 100.

Figure 2A:
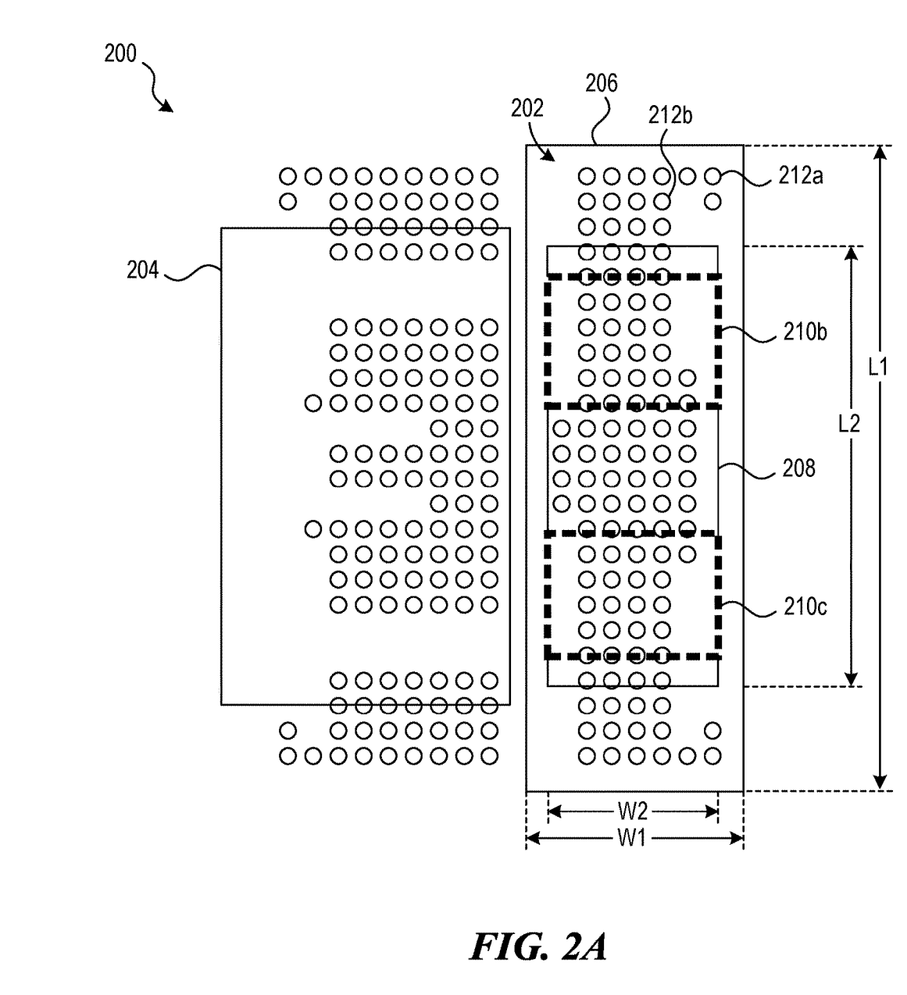
FIGS. 2A, 2B, 3A, 3B, 4A, and 4B are plan views of alignments of a top spacer and base spacers in relation to a solder ball layout of the substrate shown in FIG. 1A in accordance with the present technology.
Figure 2B:
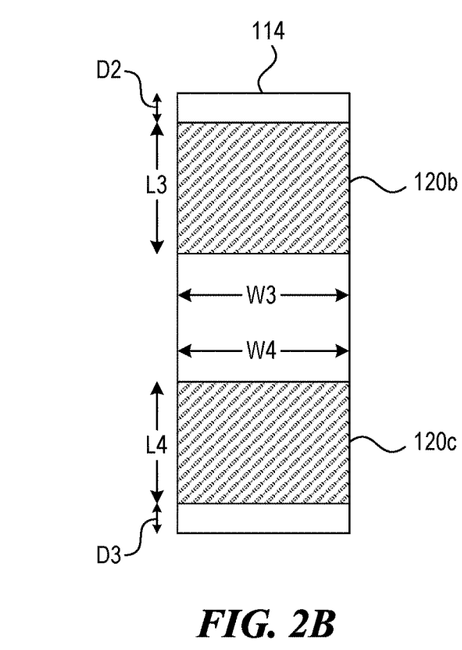
Figure 3A:
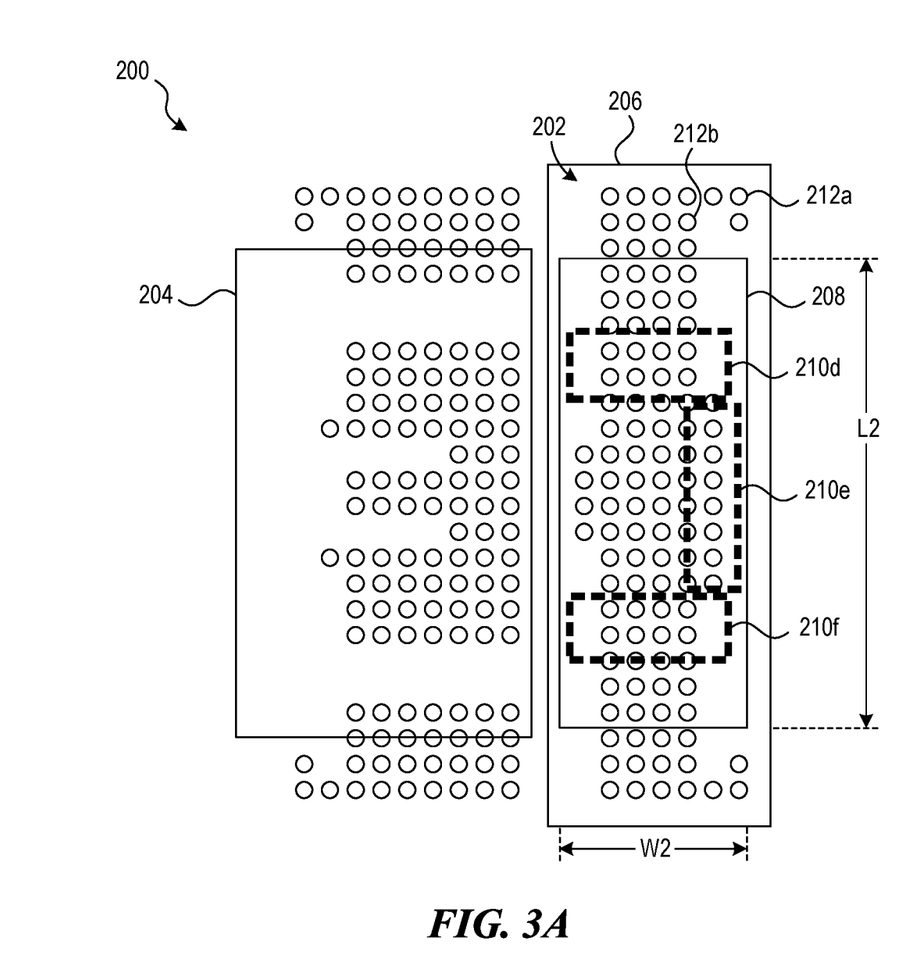
Figure 3B:
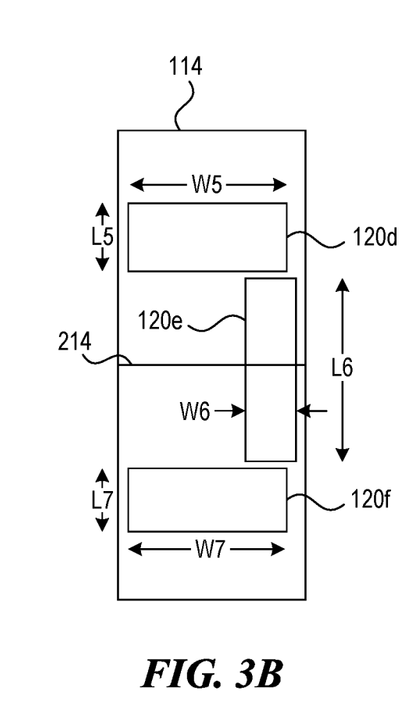
Figure 4A:
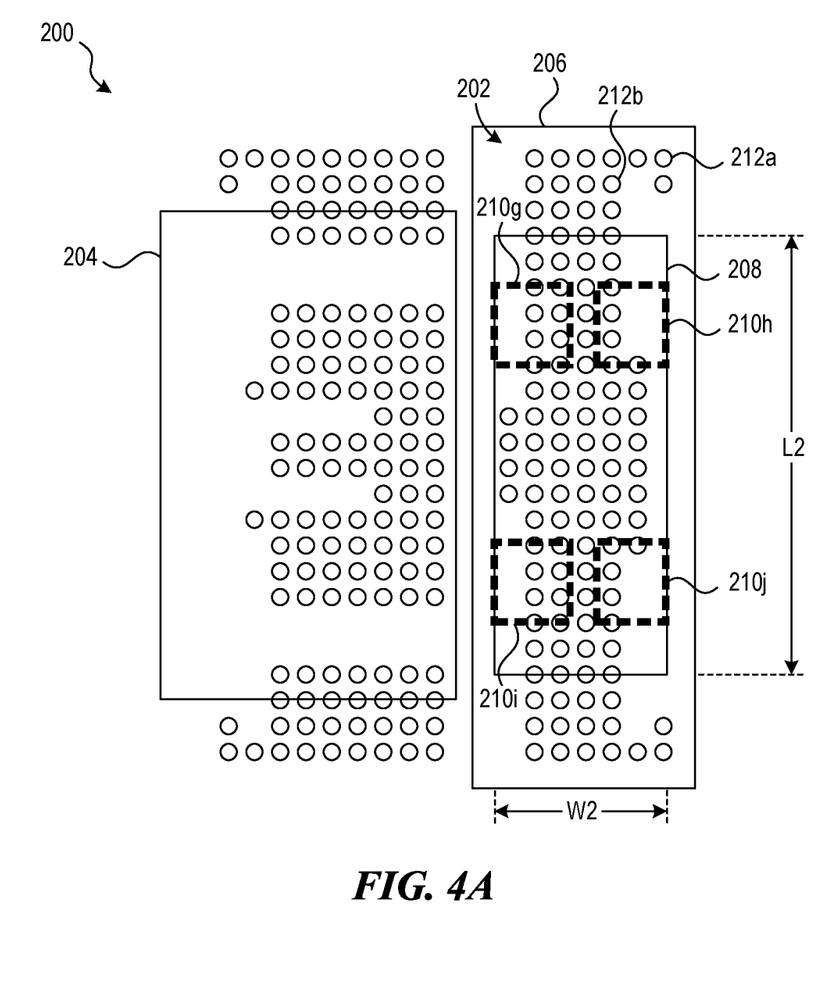
Figure 4B:
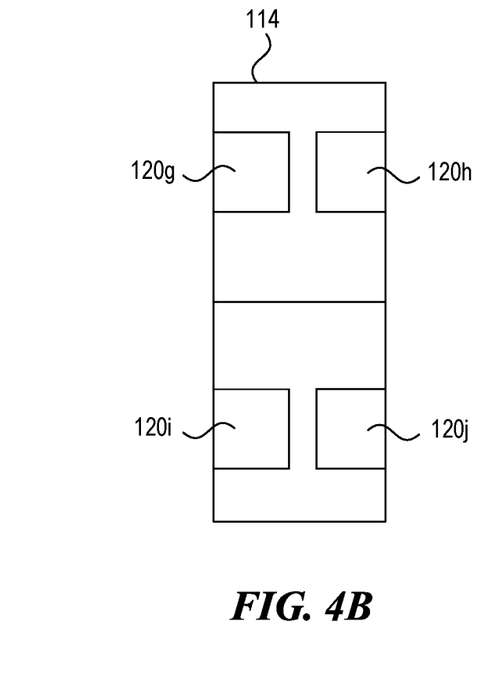

As discussed further below in relation to FIGS. 2A-4B, there can be more than one inert base spacer 120, such as two, three, four, or more separate inert base spacers 120, positioned laterally apart from each other (e.g., within the same horizontal plane) between the inert top spacer 114 and the substrate 106. FIGS. 2A, 3A, and 4A are plan views that show footprints of solder ball layouts 200, 202 in relation to the bottom dies 108a, 110a of the side-by-side die stacks 102, 104 of FIG. 1A. Individual solder balls are indicated as circles in the solder ball layouts 200, 202. In other embodiments the number and arrangement of solder balls can be different. On the left-hand side of FIGS. 2A, 3A, and 4A, a footprint 204 of the bottom die 108a (e.g., microcontroller) of the die stack 102 is shown with a rectangle. On the right-hand side, a footprint 206 of the bottom die 110a (e.g., NAND die) of the die stack 104 is shown with a different rectangle. Additionally, a footprint 208 of the inert top spacer 114 and footprints 210 of separate inert base spacers 120 are shown in relation to the solder ball layout 202 of the uplifted die stack 104. FIGS. 2B, 3B, and 4B show corresponding examples of layouts of the inert top spacer 114 and different numbers of inert base spacers 120.

Referring to FIG. 2A, solder ball 212a and solder ball 212b are located within the footprint 206 of the bottom die 110a. The solder balls 212a, 212b can be identified as being critical function solder balls that are associated with critical solder joints that can be negatively impacted by CTE mismatch during temperature fluctuations. As shown below, the inert base spacers 120 are mounted to the substrate 106 interior of the identified critical solder joints of the solder balls 212a, 212b. Although only two critical solder balls 212a, 212b are indicated, there can be additional critical solder balls that can be located within the solder ball layout 202. Also, in other embodiments one or more of the critical solder balls 212a, 212b can be located elsewhere within the solder ball layout 202.

The footprint 206 of the bottom die 110a has a length L1 and a width W1 that extends beyond a footprint of the outermost solder balls in the associated solder ball layout 202. The footprint 208 of the inert top spacer 114 has an associated length L2 and width W2. The length L2 and width W2 of the inert top spacer 114 are both less than the length L1 and width W1 of the bottom die 110a. In other embodiments, one or both of the width W2 and length L2 of the inert top spacer 114 may be equal to, or substantially or generally equal to, the width W1 and length L1, respectively, of the bottom die 110a. In still other embodiments, the inert top spacer 114 may be aligned along portions of one or more of its edges with the footprint 206 of the bottom die 110a.

In FIGS. 2A and 2B, two inert base spacers 120b, 120c are positioned on the inert top spacer 114. In the example shown, the inert base spacers 120b, 120c are rectangular in shape. Although not required, for manufacturing ease the inert base spacers 120b, 120c can be the same size and shape as each other. However, in other embodiments square, triangle, circular, and/or irregular shapes may be used, and each of the inert base spacers 120 can have a different shape and/or have different length and/or width dimensions. Multiple inert base spacers 120 that are used in the same layer of an assembly have the same or substantially equal thicknesses, within a tolerance, to keep the assembly flat or level. The tolerance may, for example, be based on die attach film thickness or other thickness tolerances that ensure that the layers remain acceptably level.

The inert base spacer 120b has a length L3 and a width W3, and the inert base spacer 120c has a length L4 and a width W4. In some cases, as shown in FIGS. 2A and 2B, the widths W3, W4 of one or more of the inert base spacers 120b, 120c can be substantially equal to the width W2 of the inert top spacer 114. The inert base spacers 120b, 120c can be positioned to be distances D2, D3, respectively, from opposite ends of the footprint 208 (e.g., opposite outer edges) of the inert top spacer 114, while extending to opposite outer side edges of the inert top spacer 114. In some embodiments the distances D2 and D3 can be equal. The inert base spacers 120b, 120c are laterally spaced with respect to each other and do not touch, interfere, or interface with each other. In other embodiments, two or more inert base spacers 120b, 120c may be positioned to touch each other.

Accordingly, the area of the footprint 208 of the inert top spacer 114 is greater than the combined areas of footprints 210b, 210c of the inert base spacers 120b, 120c that are directly attached to the inert top spacer 114. Therefore, the footprints 210b, 210c are non-overlapping and when combined can be smaller than the footprint 208 of the inert top spacer 114. In some embodiments, the footprints 210b, 210c can be positioned entirely within the footprint 208. In some embodiments, positioning the footprints 210b, 210c (e.g., footprints of inert base spacers 120b, 120c) entirely within the footprint 208 can include aligning one or more outer edges of one or more footprints 210b, 210c with outer edge(s) of the footprint 208, and/or positioning the footprints 210b, 210c interior of the outer edge(s) of the footprint 208. This reduces the contact area between the inert base spacers 120b, 120c and the substrate 106 compared to the footprint 206 of the bottom die 110a.

Turning to FIGS. 3A and 3B, three inert base spacers 120d, 120e, 120f, having the footprints 210d, 210e, 210f, respectively, are directly attached to the inert top spacer 114. As shown, two of the inert base spacers 120d, 120f are oriented horizontally (e.g., extending a proportionally greater distance along the width W2 of the inert top spacer 114), while one of the inert base spacers 120e is oriented vertically (e.g., extending a proportionally greater distance along the length L2 of the inert top spacer 114). Each of the three inert base spacers 120d, 120e, 120f is shown as mounted within the footprint 208 of the inert top spacer 114. Therefore, as shown the widths W5, W6, W7 of the inert base spacers 120d, 120e, 120f are each less than the width W2 of the inert top spacer 114, and the combined lengths L5, L6, L7 of the inert base spacers 120 are less than the length L2 of the inert top spacer 114. The inert base spacers 120d, 120e, 120f, can be arranged to be symmetrical with respect to a center line 214 (shown horizontally), or can be located closer to one end of the inert top spacer 114, as long as the inert base spacers 120d, 120e, 120f are located a required distance or tolerance away from the critical solder balls 212a, 212b. In some embodiments, one or more inert base spacers 120 can be centered with respect to a vertical center line (not shown) of the inert top spacer 114. The present technology is not limited to the illustrated layout, and other orientations of the inert base spacers 120 are contemplated.

With respect to FIGS. 4A and 4B, this embodiment shows four inert base spacers 120g, 120h, 120i, 120j, having the footprints 210g, 210h, 210i, 210j, respectively, that are directly attached to the inert top spacer 114. In some embodiments, the inert base spacers 120g, 120h, 120i, 120j can have substantially the same length and width as each other, and in some cases can be square-shaped. As shown, each of the lengths and widths of the inert base spacers 120g, 120h, 120i, 120j is less than the width W2 and length L2 of the inert top spacer 114. One edge of each of the inert base spacers 120g, 120h, 120i, 120j is aligned along an outer edge of the inert top spacer 114, although in other embodiments some or none of the inert base spacers 120g, 120h, 120i, 120j may be aligned with outer edges of the inert top spacer 114. The four inert base spacers 120g, 120h, 120i, 120j are positioned laterally to be away from each other, and thus not touching. The inert base spacers 120g, 120h, 120i, 120j are positioned a distance away from, or interior of, an outer edge of the inert top spacer 114 so that none of the inert base spacers 120g, 120h, 120i, 120j are mounted to the substrate 106 over or within a predetermined tolerance of the critical solder balls 212a, 212b.

Figure 5:
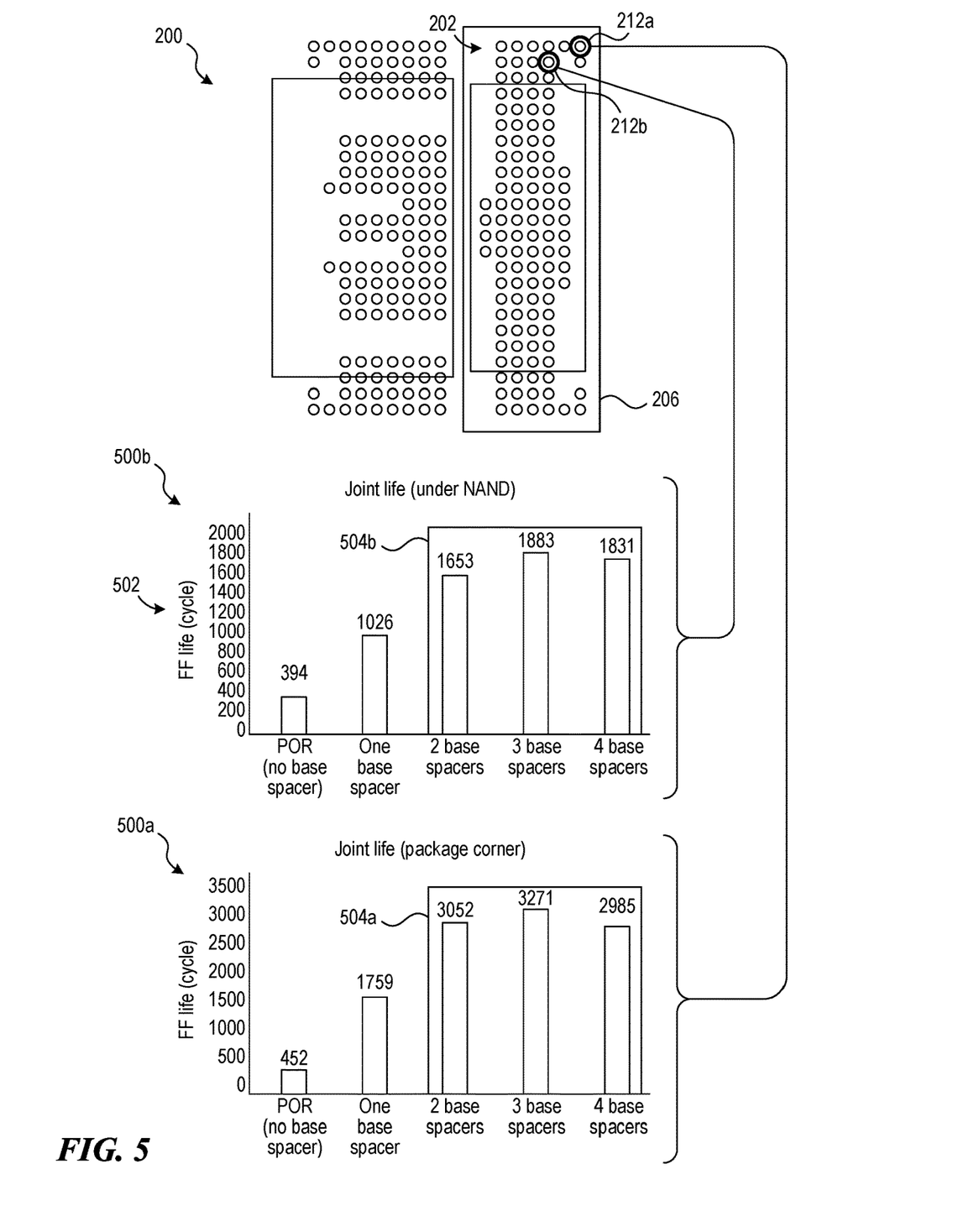
FIG. 5 shows a graphical illustration of solder joint reliability improvement with spacer-on-spacer configurations in accordance with the present technology.

FIG. 5 shows a graphical illustration of solder joint reliability improvement with spacer-on-spacer design for two solder joints in accordance with the present technology. A validated finite element simulation model had been performed to compare the expected reliability performance of critical solder joints subjected to the same temperature cyclic loading. The solder ball layouts 200 and 202 that correspond to the die stacks 102 and 104 are shown. First and second graphs 500a, 500b show a number of temperature cycles to first failure (FF) 502 along a vertical axis that are associated with the solder balls 212a, 212b, respectively, that are located proximate an outer edge of the footprint 206 of the bottom die 110a (e.g., NAND die). The horizontal axis shows the number of temperature cycles to first failure for the solder balls 212a, 212b for configurations with no base spacer, one base spacer (e.g., no inert top spacer 114, single spacer layer, etc.), and spacer-on-spacer configurations 504a, 504b that have the inert top spacer 114 and two inert base spacers 120, three inert base spacers 120, or four inert base spacers 120 as discussed in FIGS. 2A-4B. For example, the cycles may be accomplished during a temperature cycling test associated with the device 100 of FIG. 1. Both of the graphs 500a, 500b illustrate significant improvement in devices 100 that include the spacer-on-spacer configurations 504a, 504b. Furthermore, the spacer-on-spacer configurations 504a, 504b reduce strain energy density (SED) of critical solder balls 212a, 212b as well as the SED of at least some of the other solder balls 212 in the solder ball layout 202 when compared to configurations without the spacer-on-spacer arrangement.

Figure 6:
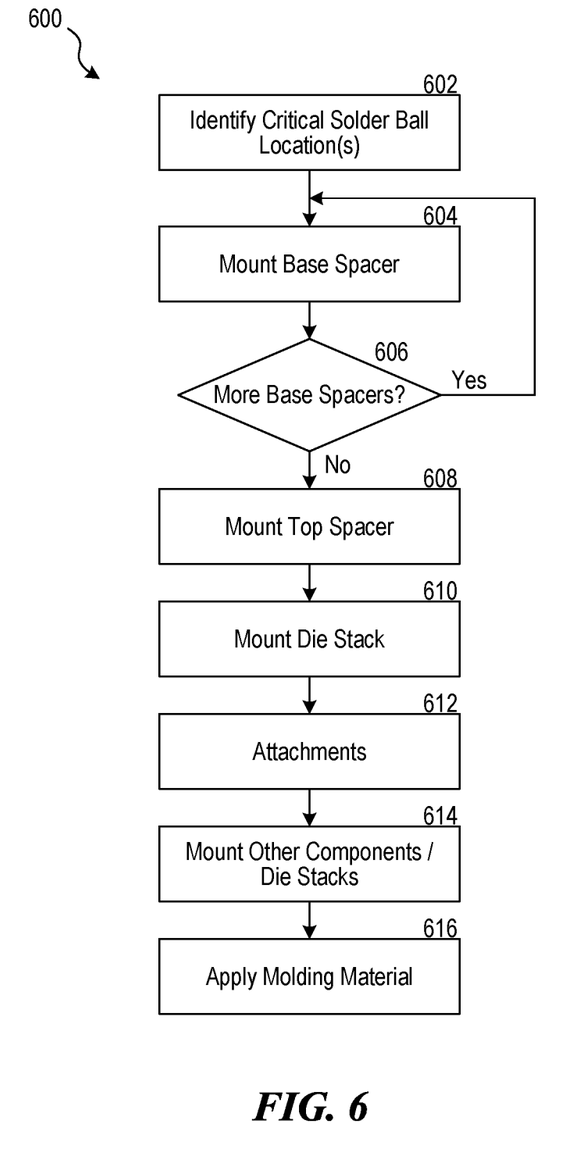
FIG. 6 is a flow chart of a method for assembling a semiconductor package assembly that includes a top spacer and at least one base spacer in a spacer-on-spacer configuration in accordance with the present technology.
Figure 7:
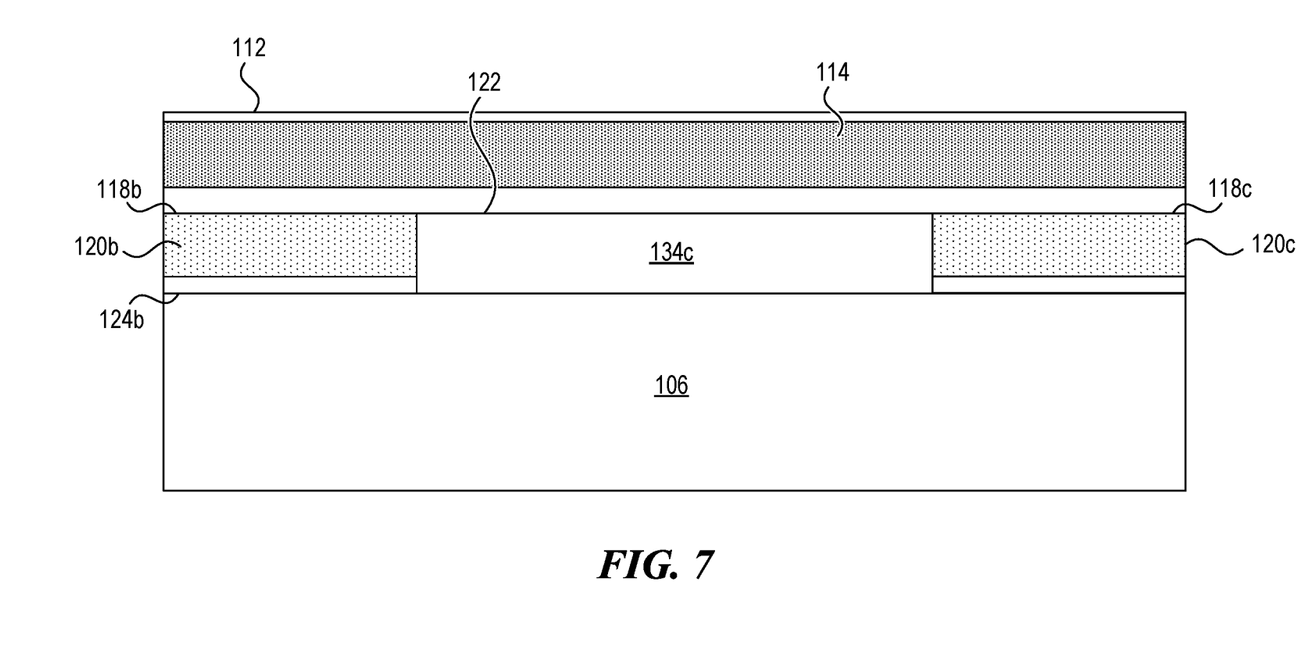
FIG. 7 shows a cross-sectional view of a portion of the substrate with a top spacer and two base spacers in the spacer-on-spacer configuration in accordance with the present technology.

FIG. 6 is a flow chart of a method 600 for assembling and/or manufacturing the semiconductor package assembly in accordance with the present technology. FIG. 7 shows a cross-sectional view of a portion of the substrate 106, the inert top spacer 114 and two base spacers, such as the inert base spacers 120b, 120c of FIGS. 2A and 2B, and will be discussed together with FIG. 6. For assembling the layers of the semiconductor package, pick-and-place technology or other known assembly technology can be used. Also, the layers can be mounted using die attach film or other materials/adhesives.

In some embodiments, the method can include identifying critical solder ball location(s), such as those associated with the solder balls 212a, 212b of FIG. 2A (block 602). The location can be different for different chip sets, and thus the configuration (e.g., number, size, and location) of the inert base spacer(s) 120 can be based at least on the location of the critical solder balls 212a, 212b. The method includes mounting or directly attaching a bottom surface 124 of a first inert base spacer 120b to a surface of the substrate 106 (block 604). If more inert base spacers 120 are to be mounted (block 606), the method returns to block 604. In the example of FIG. 7, the second inert base spacer 120c is also attached to the substrate 106 (block 604). The inert base spacer(s) 120 can be positioned such that they are within the footprint 208 of the inert top spacer 114 (as shown above in FIG. 3B), or at least one edge of an inert base spacer 120 can be aligned with at least one outer edge of the inert top spacer 114 (as shown above in FIGS. 2B and 4B). If no more inert base spacers 120 are to be mounted (block 606), the method continues to block 608.

A bottom surface 122 of the inert top spacer 114 can be directly attached or mounted to the top surfaces 118b, 118c of the inert base spacers 120b, 120c (block 608). A bottom surface 116 of the die stack 104 (as shown in FIG. 1B) can be directly attached to the top surface 112 of the inert top spacer 114 (block 610). In some embodiments a single die 110 can be mounted, while in other embodiments individual dies 110 or groups of dies 110 that form the die stack 104 can be assembled in situ.

Attachments, as needed, can be made between the dies 110 and/or between one or more dies 110 and the substrate 106 (block 612) to provide electrical connections outside of the inert top spacer 114 and the inert base spacer(s) 120. For example, wire bonding may be accomplished by attaching the wire bond(s) 132 between individual dies 110 and/or between one or more individual die 110, such as the bottom die 110a, and the substrate 106, as shown in FIG. 1B. The bottom die 110a is supported by the inert top spacer 114 as the attachments are made. Also, the distance D1 (FIG. 1B) between the bottom die 110a and the substrate 106 provides a protective space, such as the open area 134a, that prevents the corners and/or edges of the bottom die 110a from contacting the substrate 106, and thus prevents the damage that can occur due to such contact.

In some embodiments, other die stacks (e.g., the die stack 102 shown in FIG. 1A) and/or components can be mounted to the substrate 106 (block 614). It should be understood that other die(s) and/or die stacks may be mounted to the substrate 106 using a portion or all of the method of blocks 604-614 or other known methods. Also, each of the layers of dies 108, 110, the die stacks 102, 104, the inert top spacers 114, and the inert base spacers 120 can be assembled in any order, and thus the blocks can be performed iteratively and/or interleaved to mount multiple components/die stacks on the substrate 106 and/or to each other. For example, the inert top spacer 114 can be mounted to the bottom die 110a, and the inert base spacer(s) 120 can be mounted to the inert top spacer 114 before mounting the inert base spacer(s) 120 to the substrate 106.

After the components are attached/mounted, the molding material 138 can be applied (block 616). The molding material can extend into at least portions of the open areas 134a under exposed bottom surfaces 116 of the bottom die 110a of the die stack 104 to provide a buffer layer between the bottom die 110a and the substrate 106 (FIG. 1B). The molding material 138 can further extend into at least portions of the open areas 134b under at least portions of the bottom surface 122 of the inert top spacer 114 that are exposed (FIG. 1B). For example, the molding material 138 can extend to also fill open area 134c shown in FIG. 7 that corresponds to the area between the two inert base spacers 120b, 120c.

Figure 8:
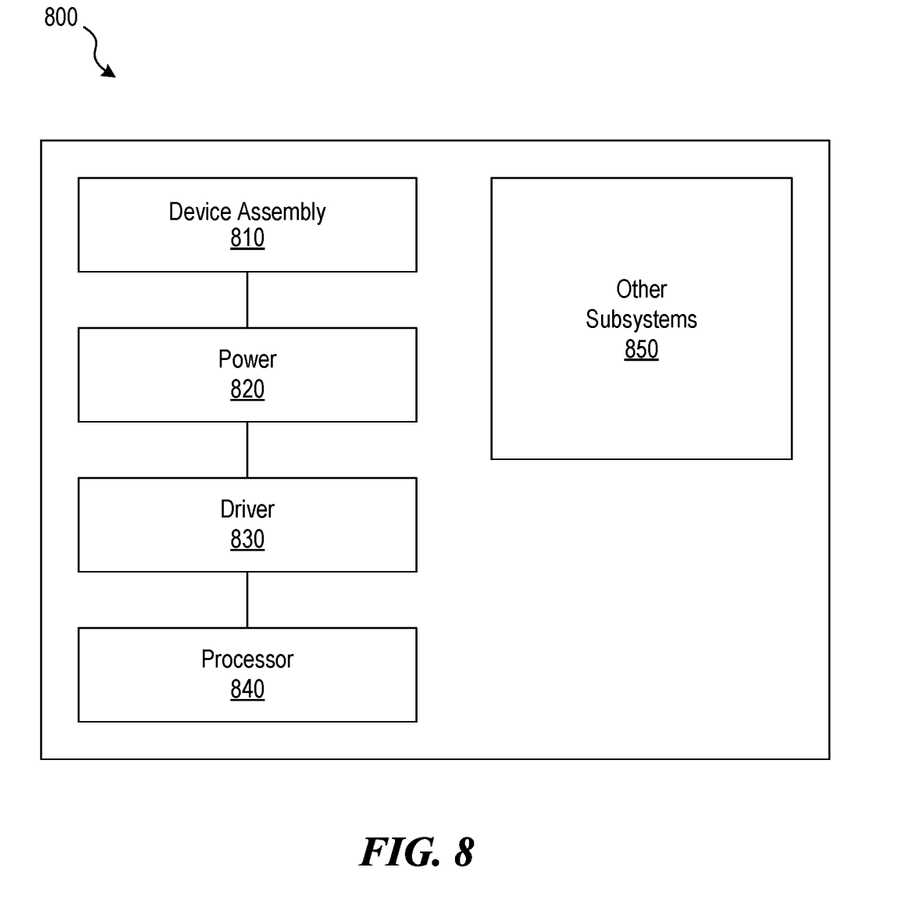
FIG. 8 is a schematic view showing a system that includes a semiconductor device assembly configured in accordance with the present technology.

Any one of the semiconductor devices, assemblies, and/or packages described above with reference to FIGS. 1A-7 can be incorporated into any of a myriad of larger and/or more complex systems, a representative example of which is system 800 shown schematically in FIG. 8. The system 800 can include a semiconductor device assembly 810, a power source 820, a driver 830, a processor 840, and/or other subsystems or components 850. The semiconductor device assembly 810 can include features generally similar to those of the semiconductor device assemblies described above. The resulting system 800 can perform any of a wide variety of functions such as memory storage, data processing, and/or other suitable functions. Accordingly, representative systems 800 can include, without limitation, hand-held devices (e.g., mobile phones, tablets, digital readers, and digital audio players), computers, vehicles and other machines and appliances. Components of the system 800 may be housed in a single unit or distributed over multiple, interconnected units (e.g., through a communications network). The components of the system 800 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor package assembly, comprising:
a substrate;
a die stack including at least a bottom die;
an inert top spacer exclusive of any circuits and having top and bottom surfaces, the top surface of the inert top spacer directly attached to a bottom surface of the die stack, the inert top spacer having a first footprint; and
a first inert base spacer exclusive of any circuits and having top and bottom surfaces, the top surface of the first inert base spacer directly attached to the bottom surface of the inert top spacer and the bottom surface of the first inert base spacer directly attached to the substrate, the first inert base spacer having a second footprint smaller than the first footprint and positioned entirely within the first footprint.

2. The semiconductor package assembly of claim 1, further comprising a second inert base spacer exclusive of any circuits mounted between the bottom surface of the inert top spacer and the substrate, the second inert base spacer having a third footprint smaller than the first footprint, the third footprint positioned entirely within the first footprint, and non-overlapping with the second footprint.

3. The semiconductor package assembly of claim 2, wherein the first and second inert base spacers have substantially equal thicknesses.

4. The semiconductor package assembly of claim 1, wherein an outer edge of the inert top spacer is laterally positioned a first distance from an outer edge of the bottom die and the first inert base spacer is laterally positioned a second distance from the outer edge of the bottom die, wherein the second distance is greater than the first distance.

5. The semiconductor package assembly of claim 1, wherein the first inert base spacer is positioned interior of at least two outer edges of the inert top spacer.

6. The semiconductor package assembly of claim 1, further comprising at least two additional inert base spacers exclusive of any circuits, the at least two additional inert base spacers having top and bottom surfaces, the top surfaces of the at least two additional inert base spacers directly attached to the bottom surface of the inert top spacer and the bottom surfaces of the at least two additional inert base spacers directly attached to the substrate, the at least two additional inert base spacers being laterally spaced apart from each other.

7. The semiconductor package assembly of claim 6, wherein the at least two additional inert base spacers are further positioned interior of at least one outer edge of the first footprint of the inert top spacer.

8. The semiconductor package assembly of claim 1, further comprising a molding material encasing the die stack, the molding material extending between exposed regions of the bottom surface of the die stack and the substrate, the molding material further extending between at least a portion of exposed areas between the bottom surface of the inert top spacer and the substrate.

9. The semiconductor package assembly of claim 1, further comprising:
a second die stack or component mounted on the substrate; and
a molding material encasing the die stack and the second die stack or component.

10. A method for forming a semiconductor package, comprising:
directly attaching a bottom surface of a first inert base spacer to a substrate;
directly attaching a bottom surface of an inert top spacer to a top surface of the first inert base spacer, wherein a first footprint of the inert top spacer is larger than a second footprint of the first inert base spacer, wherein the bottom surface of the inert top spacer is positioned a distance from the substrate such that the bottom surface of the inert top spacer does not contact the substrate, wherein the first inert base spacer and the inert top spacer are exclusive of any circuits; and
directly attaching a bottom surface of a die to a top surface of the inert top spacer.

11. The method of claim 10, further comprising directly attaching a second inert base spacer between the bottom surface of the inert top spacer and the substrate, wherein the second inert base spacer is separate from the first inert base spacer.

12. The method of claim 11, wherein the first and second inert base spacers are positioned entirely within the first footprint of the inert top spacer.

13. The method of claim 11, further comprising directly attaching at least two additional inert base spacers to the bottom surface of the inert top spacer and to the substrate, wherein the at least two additional inert base spacers are laterally spaced apart from each other and from the first inert base spacer.

14. The method of claim 13, wherein the at least two additional inert base spacers are each further positioned interior of at least two outer edges of the first footprint of the inert top spacer.

15. The method of claim 10, further comprising:
identifying a location associated with the substrate of at least one critical solder ball; and
positioning the first inert base spacer laterally interior of the at least one critical solder ball location, wherein the first inert base spacer is not in contact with the substrate over the at least one critical solder ball location.

16. A semiconductor package assembly, comprising:
a substrate;
a die stack including at least two semiconductor dies, the die stack having a bottom die with a die footprint;
an inert top spacer exclusive of any circuits and having top and bottom surfaces, the top surface of the inert top spacer directly attached to a bottom surface of the die stack, the inert top spacer having an inert top spacer footprint;
a first inert base spacer exclusive of any circuits and having top and bottom surfaces, the top surface of the first inert base spacer directly attached to the bottom surface of the inert top spacer and the bottom surface of the first inert base spacer directly attached to the substrate, the first inert base spacer having a first inert base spacer footprint that is smaller than the inert top spacer footprint; and
molding material encasing a top side and side edges of the die stack, the molding material further encasing at least one open region between the bottom surface of the die stack and the substrate, the molding material further encasing at least one open region between the bottom surface of the inert top spacer and the substrate.

17. The semiconductor package assembly of claim 16, further comprising a second inert base spacer exclusive of any circuits mounted between the bottom surface of the inert top spacer and the substrate, wherein the first and second inert base spacers are positioned interior of at least one outer edge of the inert top spacer footprint.

18. The semiconductor package assembly of claim 16, wherein the first inert base spacer is positioned interior of a critical solder ball location on the substrate, the critical solder ball location being within the die footprint.

19. The semiconductor package assembly of claim 16, further comprising at least two additional inert base spacers mounted between the bottom surface of the inert top spacer and the substrate, wherein the first insert base spacer and the at least two additional inert base spacers are positioned laterally interior of a critical solder ball location on the substrate, the critical solder ball location being within the die footprint.

20. The semiconductor package assembly of claim 16, further comprising an electrical connection extending from the bottom die to the substrate, wherein the electrical connection is outside of the inert top spacer and first inert base spacer.

* * * * *